United States Patent [19]

Keem et al.

[11] Patent Number: 4,608,296
[45] Date of Patent: Aug. 26, 1986

[54] SUPERCONDUCTING FILMS AND DEVICES EXHIBITING AC TO DC CONVERSION

[75] Inventors: John E. Keem; Stanford R. Ovshinsky; Hossein Sadate-Akhavi, all of Bloomfield Hills; Juei-Teng Chen, Sterling Heights; Alan M. Kadin, Troy, all of Mich.

[73] Assignee: Energy Conversion Devices, Inc., Troy, Mich.

[21] Appl. No.: 558,616

[22] Filed: Dec. 6, 1983

[51] Int. Cl.$^4$ .................. H01L 39/22; H01L 21/203
[52] U.S. Cl. ........................ 428/215; 307/151; 307/306; 338/325; 357/4; 357/5; 363/14; 428/216; 428/220; 428/338; 428/457; 428/688; 428/930
[58] Field of Search ............ 427/62, 63; 428/930, 428/220, 338, 215, 216, 457, 233, 688; 357/4, 5; 338/325; 363/14; 307/151, 306

[56] References Cited

U.S. PATENT DOCUMENTS

| | | | |
|---|---|---|---|
| 3,481,778 | 12/1969 | Neugebauer | 428/930 |
| 3,897,542 | 7/1975 | Economy et al. | 427/399 |
| 4,093,503 | 6/1978 | Harris et al. | 357/5 |
| 4,103,075 | 7/1978 | Adam | 428/930 |
| 4,242,419 | 12/1980 | Dayem et al. | 427/62 |
| 4,261,771 | 4/1981 | Dingle et al. | 156/610 |
| 4,325,795 | 4/1982 | Bourgoin | 427/62 |
| 4,336,280 | 6/1982 | Müller | 427/62 |
| 4,339,508 | 7/1982 | Tsuya et al. | 428/338 |
| 4,358,783 | 11/1982 | Hebard et al. | 357/5 |
| 4,395,813 | 8/1983 | Roth et al. | 427/62 |
| 4,412,902 | 11/1983 | Michikami et al. | 427/62 |
| 4,439,269 | 3/1984 | Cukauskas | 427/62 |
| 4,447,492 | 5/1984 | McKaveney | 428/328 |
| 4,454,522 | 6/1984 | de Lozanne | 357/5 |
| 4,458,409 | 7/1984 | Latta et al. | 427/62 |
| 4,478,877 | 10/1984 | Krevet et al. | 427/62 |
| 4,495,510 | 1/1985 | Roth et al. | 357/5 |
| 4,503,447 | 3/1985 | Iafrate et al. | 357/4 |

FOREIGN PATENT DOCUMENTS 0056484 4/1983 Japan .................................. 357/5

OTHER PUBLICATIONS

"The American Heritage Dictionary" 2nd College Edit., p. 359, 1982.
Tsuboi, T.; Physics Letters, vol. 56A, No. 6, May 1976, p. 472.
Testardi, L. R.; Applied Physics Letters, vol. 29, No. 9, pp. 579-580, Nov. 1976.
Van Nos Strand's Scientific Encyclopedia; 5th Edit., Van Nos Strand; Reinhold; NY (1976).

Primary Examiner—George F. Lesmes
Assistant Examiner—W. M. Atkinson
Attorney, Agent, or Firm—John T. Winburn

[57] ABSTRACT

Superconducting films and devices are provided which exhibit an AC to DC conversion effect of an RF AC input signal. The films can be microscopically inhomogeneous with granular or columnar microstructures in layered or nonlayered structures, which provide the conversion effect with and without an applied magnetic field. The films also can be multilayer films which provide the conversion effect with a magnetic field applied to the films. The multilayer films are substantially compositionally homogeneous within the layers and the microscopically inhomogeneous films are substantially compositionally homogeneous throughout, but include structural inhomogeneities.

13 Claims, 15 Drawing Figures

SUPERCONDUCTING FILMS AND DEVICES EXHIBITING AC TO DC CONVERSION

BACKGROUND OF THE INVENTION

This invention relates to superconducting films and devices incorporating the films and a method of synthesizing the films and devices. The superconducting films exhibit a type of Josephson tunnel junction effect. The films can be microscopically inhomogeneous, for example, films including granular or columnar microstructures and can be some types of multilayer films which have inhomogeneities therein and combinations thereof. These films provide an AC to DC conversion effect in the absence and in the presence of an applied magnetic field. The films also can be multilayer films which do not have substantial inhomogeneities which provide an AC to DC conversion effect when a magnetic field is applied to the films. The microscopically inhomogeneous films are essentially compositionally homogeneous, but are structurally inhomogeneous. Both the multilayer films with inhomogeneities and the multilayer films without inhomogeneities therein are essentially compositionally homogeneous within each layer.

A Josephson tunnel junction generally includes a thin tunnel barrier layer sandwiched between two thin superconducting metallic layers. The voltage across a Josephson junction is capable of rapidly switching from zero volts to a finite voltage when a critical current is passed through the junction. The Josephson junction devices can be utilized in numerous types of electronic circuit elements, such as logic and memory circuits and devices including switches, diodes, transistors, amplifiers, rf and microwave detectors, generators and mixers, etc.

Conventional Josephson junctions generally are formed by thermally evaporating lead or other superconducting metal layer or film onto a substrate in an evacuated deposition chamber. The tunnel barrier layer can be formed by oxidizing the exposed surface of the lead layer. A second lead layer is then thermally evaporated onto the barrier layer. Other techniques have also been utilized to form the junctions, including the reactive ion beam-sputter deposition of a superconducting metal in the presence of oxygen.

In these prior devices, the superconducting layer deposited on the substrate generally is designated the base electrode and the second superconducting layer is designated the counter electrode. The voltage which is developed across a Josephson junction is determined by the materials from which the base and counter electrodes are formed. In the case of the lead-lead oxide-lead junctions, the voltage developed is approximately equal to twice the energy gap of lead or about 2.5 millivolts. Thus, to utilize these junctions in a high voltage switch, it is necessary to connect a plurality of the junctions in series. This typically is accomplished by numerous deposition steps or by a complicated masking procedure.

Numerous attempts to construct both natural and new crystalline analogue materials have been made with the aim of extending the range of material properties heretofore limited by the availability of natural crystalline materials. One such attempt is layering or compositional modulation by molecular beam epitaxy (MBE) deposition on single crystal substrates. For example, in Dingle et al., U.S. Pat. No. 4,261,771, the fabrication of monolayer semiconductors by one MBE technique is described. These layered or modulated prior art structures are typically called "superlattices." Superlattices are developed on the concept of layers of materials forming a one-dimensional periodic potential having a periodic length larger than a typical interatomic distance. The superlattices are formed by a periodic variation of composition or of impurity density. Typically, the largest period in these superlattices is on the order of a few hundred Angstroms; however, monatomic layered structures have also been constructed. One-dimensional superlattices can be characterized by the format of a layer of a substance A (such as GaAs) followed by a layer of a substance B (such as GaAlAs), in a repetitive manner; formed on a single crystal substrate. The desired superlattice is a single crystal synthetic material with good crystalline quality and long range order. The conventional superlattice concepts have been utilized for special electronic and optical effects.

In addition to superlattices, Dingle discloses quasi-superlattices and non-superlattice structures. The former are comprised of epitaxially grown islands of a foreign material in an otherwise homogeneous layered background material. Non-superlattice structures are an extension of quasi-superlattice materials in that the islands are grown into columns extending vertically through the homogeneous layered background material. These superlattice type structures suffer from the same problems that plague homogeneous crystalline materials. There is very little variation possible in the range of constituents and in the type of superlattices constructed, because of the requirement that the crystalline periodicity of layer substance A be approximately the same as that of the layer substance B at each interface of A and B. These superlattices are restricted to a small number of crystalline materials and the growth rates are constrained by the MBE technique.

In addition to the MBE type of superlattice construction techniques, other researchers have developed layered synthetic microstructures utilizing different forms of vapor deposition, including diode and magnetron sputtering and standard multisource evaporation. The layer dimensions are controlled by shutters or by moving the substrates relative to the material sources or controlling reactive gas partial pressure or with combinations of shutters and relative motion. The layers typically are formed in a structure in only one type of deposition system. The materials reported have been formed from crystalline layers, noncrystalline layers and mixtures thereof; however, each of the efforts so far reported is directed at the synthesis of superlattice-type structures by precisely reproducing the deposition conditions on a periodically reoccurring basis. These materials can be thought of as synthetic crystals or crystal analogues in which it is crucial that the long range periodicity, repetition of a particular combination of layers or grading of layer spacing be maintained. These structures are both structurally and chemically homogeneous in the x-y plane, but are periodic in the third (z) direction.

Other works which are assigned to the present assignee, as described for example in U.S. patent application Ser. No. 422,155, entitled Compositionally Varied Materials And Method For Synthesizing The Materials, describe forming various types of matrices and dispersing nonequilibrium configurations therein. The principles of layering and compositional modulation in the prior work is dependent upon the amounts of material distributed on an atomic and molecular scale throughout the material. For example, as described in some of the prior work, very small amounts of material were added to a matrix to increase the bulk resistance properties of the resulting material. The addition of larger amounts of material to the matrix decreases the bulk resistance properties. The principles are utilized to modify a range of materials from dielectric to semiconducting to metallic materials. In metallic materials, the addition of larger amounts of material to the matrix does not necessarily decrease the bulk resistance properties. The superconducting properties of the materials also can be enhanced. These techniques provide a distribution of material configurations on an atomic and molecular scale from microscopic to macroscopic configurations in the matrix material. The distribution of compositional changes of a primarily nonequilibrium nature lead from individual atoms or groups of atoms to layering when sufficient amounts of material are introduced into the matrix. These techniques provide significant control of material properties such as thermal and electrical conductivity and other parameters by introducing atoms and alloys into materials which bond in a manner not previously described.

SUMMARY OF THE INVENTION

The invention provides superconducting films and devices which exhibit a type of Josephson tunnel junction effect to provide AC to DC conversion of an RF AC input signal. The films can be microscopically inhomogeneous having granular or columnar microstructures or multilayer structures with inhomogeneities therein, which provide AC to DC conversion in the presence or absence of an applied magnetic field. The films also can be multilayer films without substantial inhomogeneities therein, which provide AC to DC conversion when a magnetic field is applied to the films.

The microscopically inhomogeneous films are essentially compositionally homogeneous, but have structural inhomogeneities. The multilayer films are essentially compositionally homogeneous within each layer.

BRIEF DESCRIPTION OF THE DRAWINGS

FIGS. 9A(b–d) and 9B are graphs of $V_{dc}$ versus the applied parallel magnetic field ($H_\parallel$) for an increasing rf amplitude;

DESCRIPTION OF THE PREFERRED EMBODIMENTS

Figure 1A:
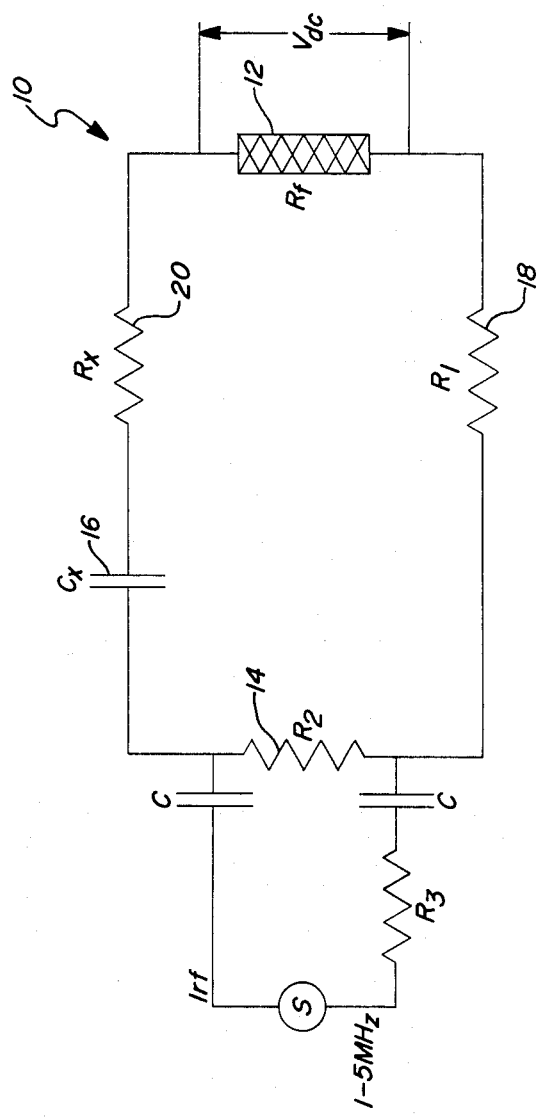
FIG. 1A is a circuit diagram utilized for measuring the AC to DC conversion effect of the invention.

Referring to FIG. 1A, there is illustrated a schematic representation of a circuit 10 for measuring the AC to DC conversion effect in the microscopically inhomogeneous films of the invention. Utilizing the circuit 10, a DC voltage $V_{dc}$ is induced near the transition temperature in one embodiment of a superconducting film 12 of the invention. The induced voltage $V_{dc}$ is an emf induced voltage as will be described hereinafter. It is believed that the emf is originated from the AC Josephson effect in weakly coupled superconducting-normal-superconducting regions or in phase-slip centers in the film 12. The most pronounced effect yet observed has been in cosputtered MoC films, which exhibit columnar microstructures, on the order of 100 Å, by X-ray diffraction analysis.

There is a great deal of interest in long range ordering of the phase of the superconducting order parameter. Close to the superconducting transition or critical temperature ($T_c$), a macroscopically uniform film can be inhomogeneous in microscopic scale, which results in weakly coupled Josephson junctions or phase-slip centers. Thus, a superconducting film which has a long range ordering can be a useful device, because a sufficient number of Josephson junctions are coupled together in a single film to provide a sufficient voltage.

Figure 1B:
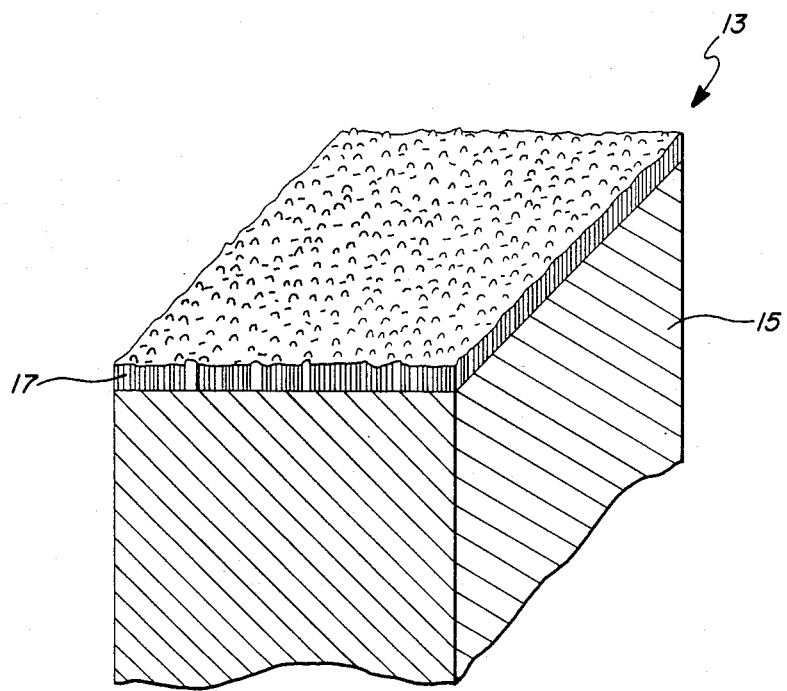
FIG. 1B is one embodiment of a microscopically inhomogeneous film embodiment of the invention.

A first columnar embodiment 13 of the cosputtered microscopically inhomogeneous superconducting films of the invention is illustrated in FIG. 1B. The columnar structure 13 is formed on a substrate 15 and has a plurality of structural columns 17 formed thereon. The substrate 15 can be any of a number of materials, depending upon the application. The inhomogeneous films can include a number of materials, generally one or more metallic materials or elements, such as Mo, Nb, V, W and Zr. The films can include other transition or other elements, especially in small amounts which do not affect the microstructure. The films also include one or more nonmetallic materials or elements, such as B, C, Ge, N, P and Si. The films can include small amounts of oxygen in alloying form, but substantial inhomogeneous oxide inclusions are not included.

The most pronounced effect yet observed is in films with a columnar or granular microstructure on the order of 100 Å, separated by 5–10 Å. These films show the AC and DC effect with and without a magnetic field applied. The circuit 10 has been utilized to analyze the films by utilizing an inverse AC Josephson effect, i.e. measuring the voltage $V_{dc}$ induced by an RF current ($I_{rf}$). Some of the representative, but unoptimized results are illustrated in Table 1.

TABLE 1

| Composition | $V_{dc}$ (microvolts) | Conversion Factor |
|---|---|---|
| $Mo_{63}C_{37}$ | 3 | $1.5 \times 10^3$ |
| $Mo_{60}C_{34}O_6$ | 30 | $1.5 \times 10^4$ |
| $Mo_{40}C_{20}Ge_{20}$ | 19 | $5 \times 10^3$ |
| $Mo_{54}B_{32}P_{14}$ | 40 | $2 \times 10^4$ |

The films were formed by magnetron sputtering at room temperature in argon with 2 microns background pressure. The first MoC film in Table 1 has columnar microstructures and exhibited a best optimized RF to DC conversion factor n of about $0.5 \times 10^6$ for a single film. Optimized means the best choice of $I_{rf}$ and T with a particular microstructure, which parameters have not yet been fully optimized. The conversion factor n is determined from the Josephson voltage-frequency formula:

$$n = \frac{V_{dc}}{(fh/2e)}$$

where $V_{dc}$ is the induced DC voltage, f is the RF input frequency and h/2e is the magnetic flux quantum. Conventionally, the Josephson effect is observed in the form of constant voltage steps in the current-voltage characteristic of a sample exposed to electromagnetic radiation.

For the superconducting film 12, it is more convenient to observe the induced $V_{dc}$ from the applied current $I_{rf}$. The transition temperatures ($T_c$) of the films of the invention range from 2 to 10 Kelvin and the sheet resistance ranges from 1 to 50 ohms. The measured films were typically 4 mm in length, 0.38 mm in width and 500 to 10,000 Å thick. Depending upon $T_c$, the films were either directly immersed in normal and superfluid helium or in the helium vapor above the helium.

The strength of the Josephson effect near $T_c$ was most affected by the structure of the film and as stated above the columnar microstructure MoC films evidenced the largest effect yet observed. The inhomogeneous films can include small grain structures and columnar structures in a layered or nonlayered film. One example in a layered structure, is a thick alternating first metallic layer A, which is alternated with a very thin nonmetallic layer B, such as silicon. The silicon can be less than a monolayer or can agglomerate to form the inhomogeneities. In these films a characteristic length is defined as one-half the smallest effective column or grain dimension. For a substantial effect to occur, the length has been on the order of 500 Å or less, and preferably is on the order of 100 Å or less.

In the circuit 10, the AC current $I_{rf}$ at a frequency (f) of 1 to 5 MHz is input across a source resistance 14. The induced voltage $V_{dc}$ is measured across the film 12. The voltage $V_{dc}$ was also observed utilizing a transformer in place of the source resistance 14 and by utilizing RF radiation to eliminate direct physical contact with the film 12.

Figure 2A:
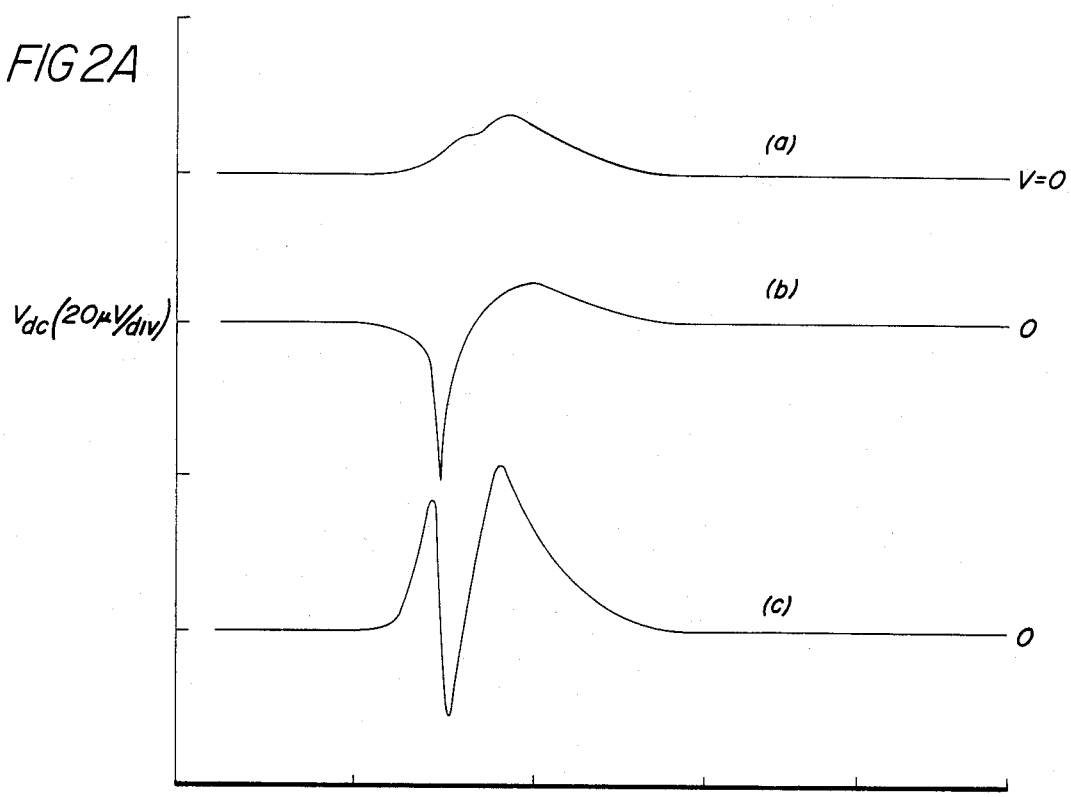
FIG. 2A is a graph of the induced DC voltage $V_{dc}$ for three different peak-to-peak values of the AC input current on one film embodiment of the invention.
Figure 2B:
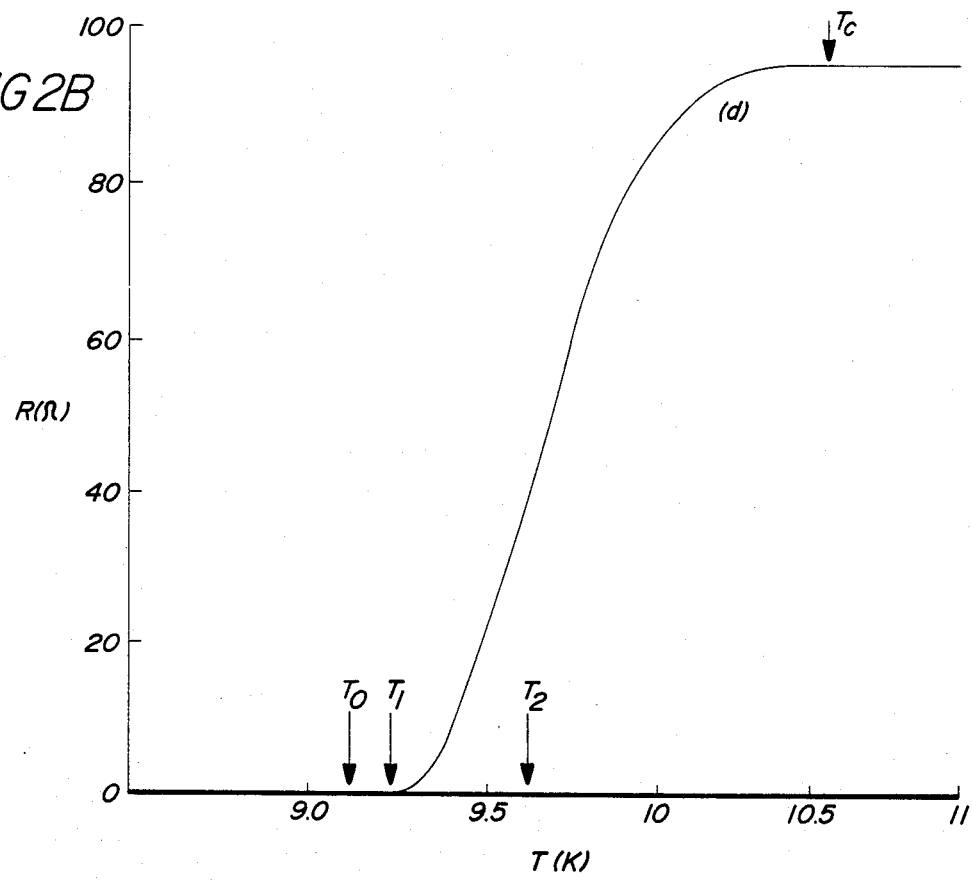
FIG. 2B is a graph of the resistive transition curve of the film utilized in FIG. 2A.

Three values of $V_{dc}$ were obtained versus the temperature (T), as illustrated in FIG. 2A (a), (b) and (c). The film measured was a cosputtered MoC film with a resistive transition curve illustrated in FIG. 2B. The voltage $V_{dc}$ is in the temperature region where the resistive transition occurs. Only with a very large $I_{rf}$ does $V_{dc}$ extend into the superconducting region. For a current $I_{rf}$ less than 1 microamp peak-to-peak at 5 MHz (for this film) only one $V_{dc}$ peak (a) occurs near the middle of the transition temperature. As the magnitude of $I_{rf}$ is increased, $V_{dc}$ oscillates as a function of temperature (b and c).

Figure 3:
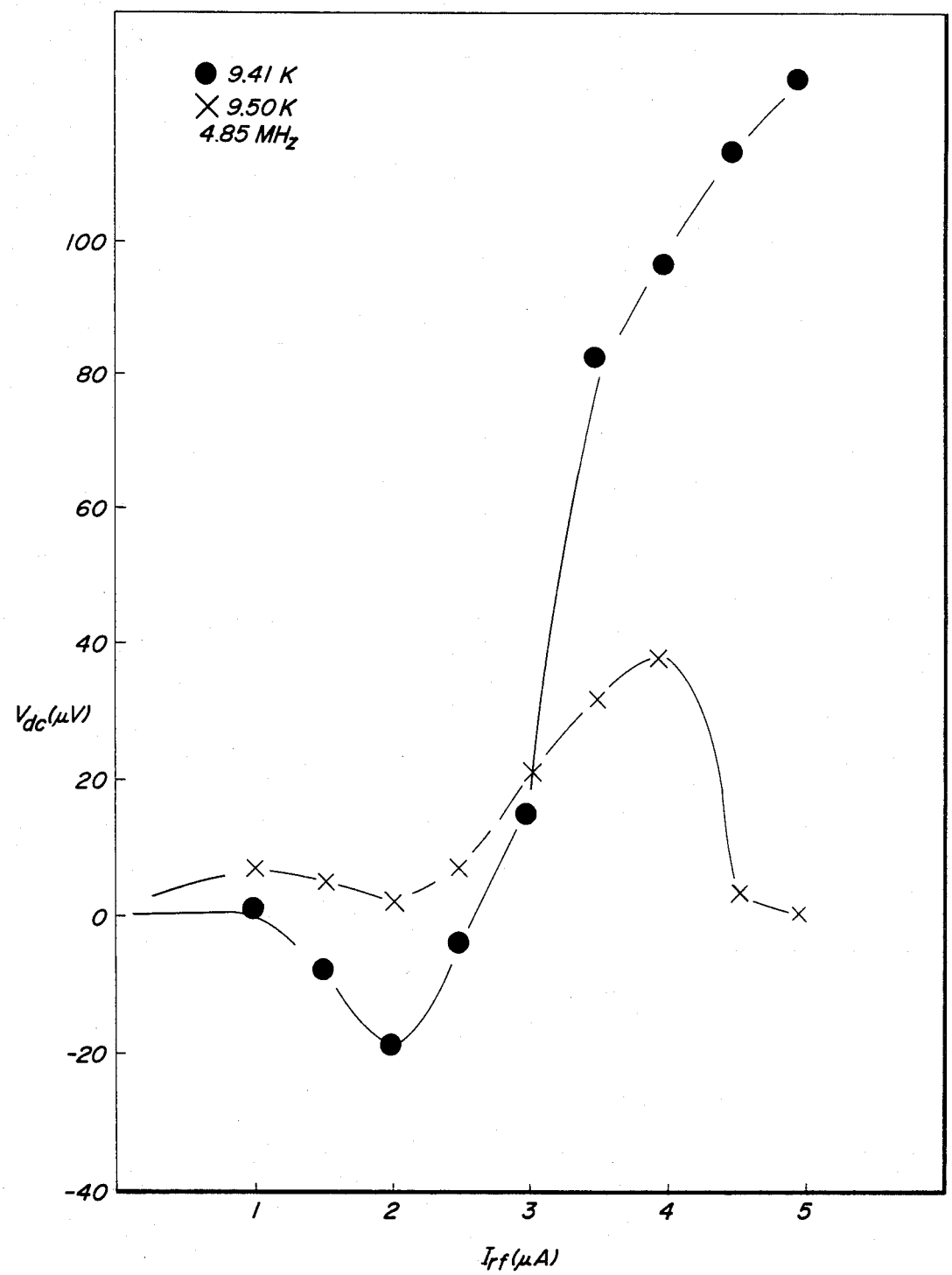
FIG. 3 is a graph of the induced DC voltage versus input current amplitude for an input AC frequency of 4.85 MHz for two temperatures near the superconducting transition region.
Figure 4:
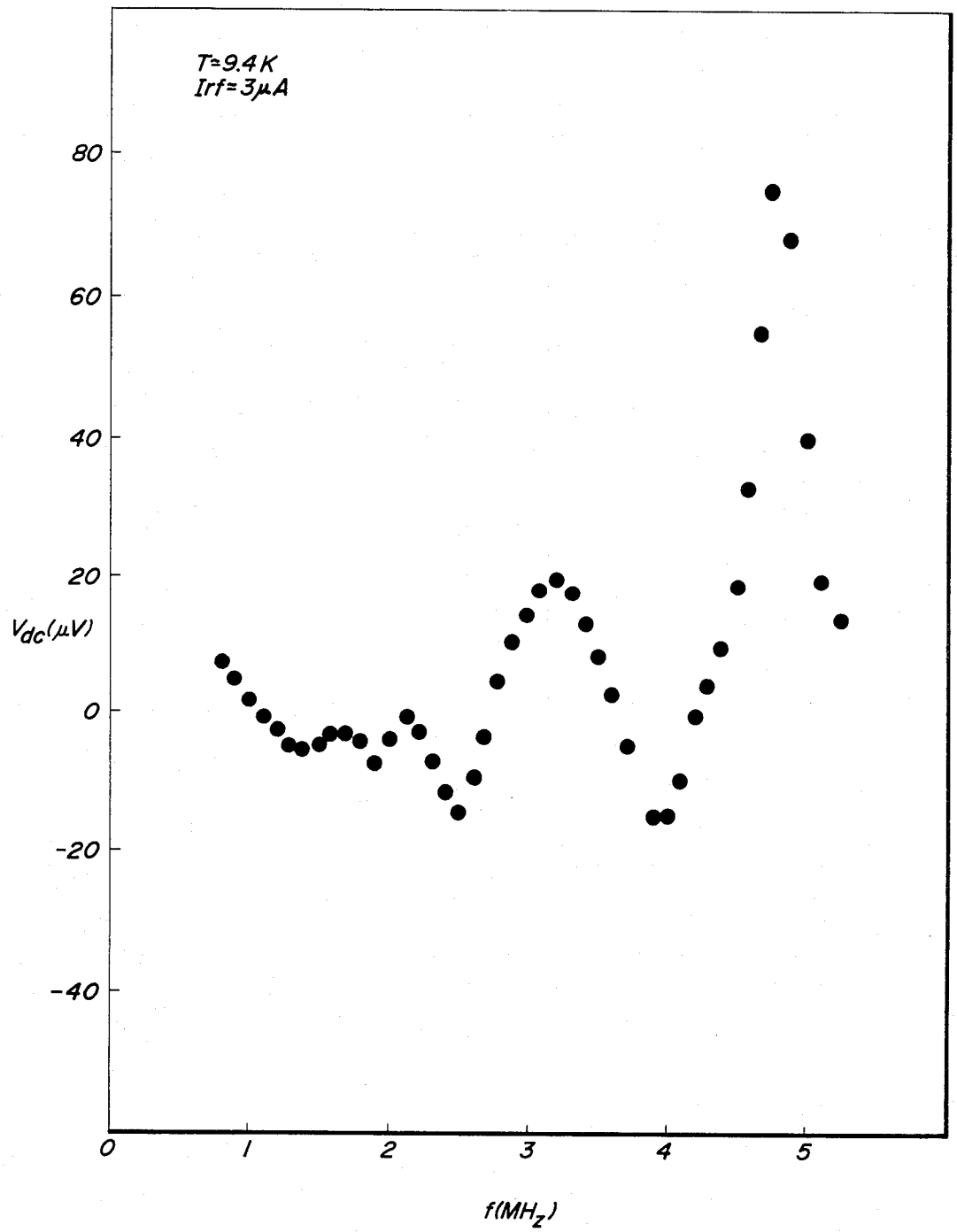
FIG. 4 is a graph of the induced DC voltage versus input current frequency for an input AC peak-to-peak amplitude of 3 microamps.

The oscillation in $V_{dc}$ as $I_{rf}$ is increased in magnitude is illustrated in FIG. 3. The oscillation in $V_{dc}$ as the frequency of $I_{rf}$ is increased is illustrated in FIG. 4. The oscillations in $V_{dc}$ appear to become less pronounced at large magnitudes of $I_{rf}$.

Referring again to FIG. 1, only an AC effect in the circuit 10 and film 12 is insured by a blocking capacitor 16 which blocks the effects of any DC current. To analyze $V_{dc}$ the capacitor 16 is removed from the circuit 10. The DC current is measured simultaneously at a resistor 18. $V_{dc}$ can be varied by changing the value of a load resistor 20, the amplitude of $I_{rf}$, the frequency, as well as the temperature.

If the voltage $V_{dc}$ was a resistive voltage drop, the voltage would be determined by the resistance $R_f$ of the film 12, in accordance with the formula $V_{dc} = IR_f$. I being the current passing through the film 12, which would flow into the positive terminal of the film 12.

The observed voltage $V_{dc}$ generates a DC current $I_{dc}$, which flows out of the positive terminal of the film 12. The magnitude of the current $I_{dc}$, also is inversely proportional to $R_T$ in accordance with the formula:

$$I_{dc} = \frac{-V_{dc}}{R_T}$$

where $R_T$ is the total resistance of the circuit 10. The relationship holds for the entire temperature region in which $V_{dc}$ is observed and in the entire frequency range (1–5 MHz) and $I_{rf}$ amplitude range (0–10 microamps peak-to-peak) which was tested. These results demonstrate conclusively that $V_{dc}$ is an internal emf being generated by the rf current rather than a passive resistance drop.

Figure 5:
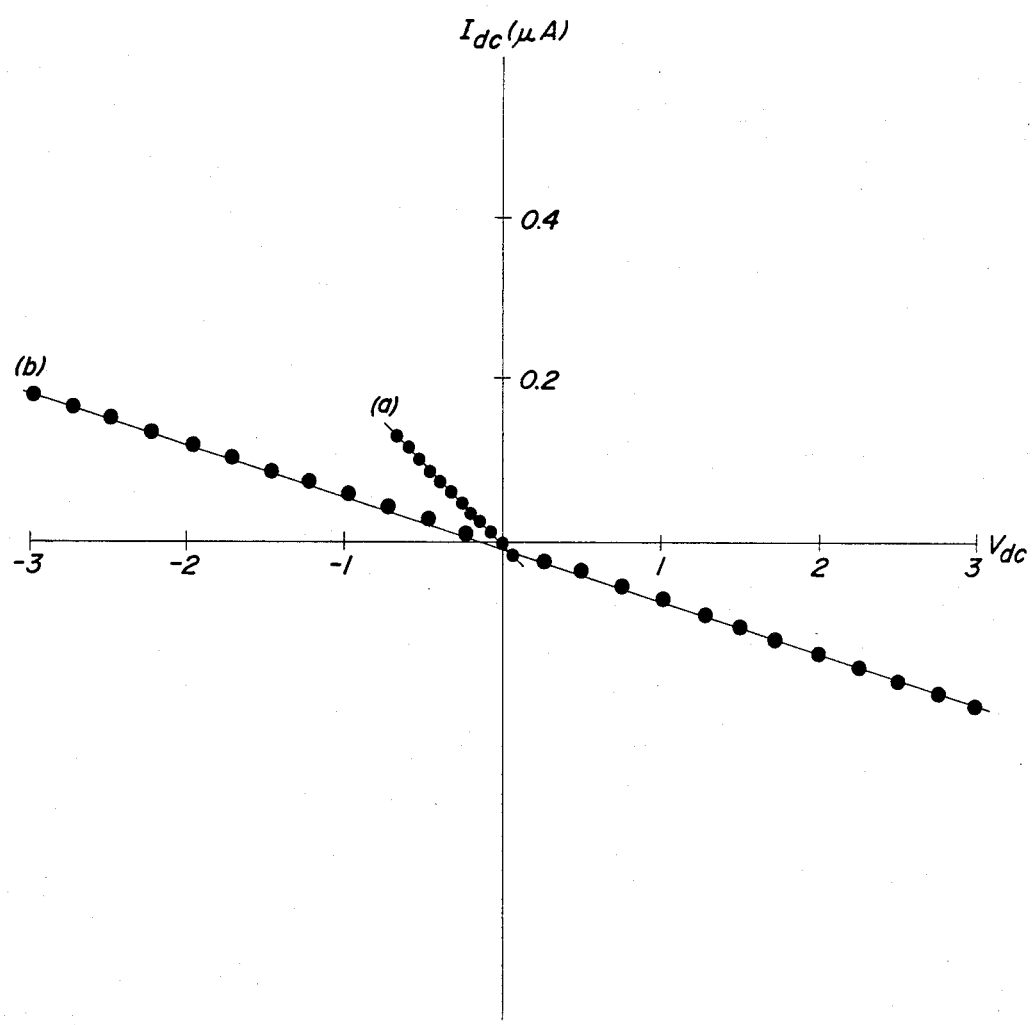
FIG. 5 is a graph of the induced DC current versus induced DC voltage for two different resistances of the circuit of FIG. 1.

Two examples of $I_{dc}$ versus $V_{dc}$ as a function of $R_T$ are illustrated in FIG. 5. Curve (a) results from an $R_T$ of 252 ohms and curve (b) results from an $R_T$ of 3250 ohms.

Figure 6:
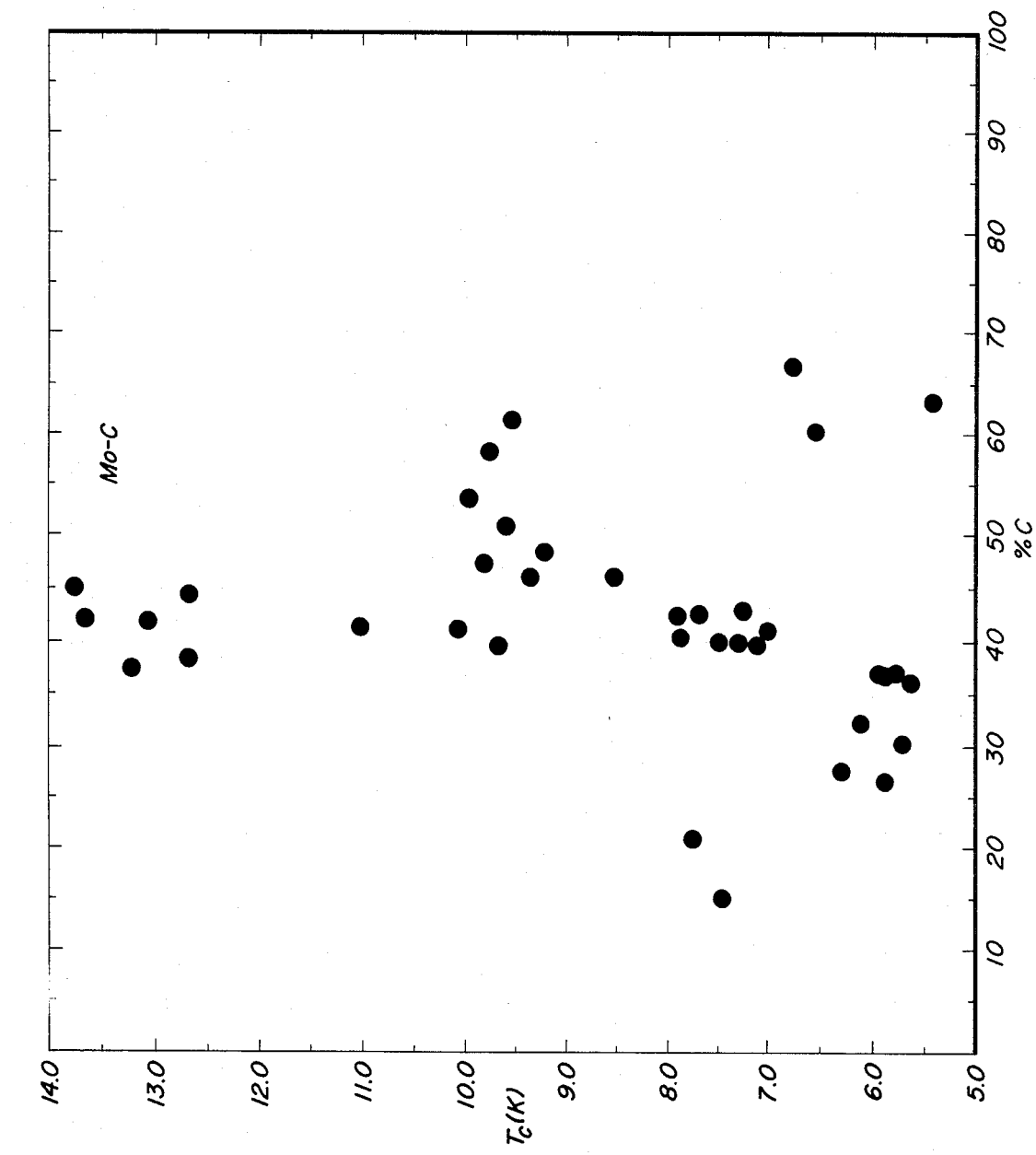
FIG. 6 is a graph of the critical temperature ($T_c$) of some films of the invention.

The inhomogeneities in the films of the invention range from 10 to $10^3$ Å. In the MoC films, $T_c$ varies in magnitude by large amounts with small changes in structure, especially when the composition is near $Mo_{63}C_{37}$, as illustrated in FIG. 6. Films with a carbon content of less than 37%, generally are amorphous, without their being structurally inhomogeneous as encompassed by the invention. $T_c$ decreases from 8 to 5.5 Kelvin as the carbon concentration increases. In the range of 37 to 45% carbon content, $T_c$ varies from 5.5 to 12 Kelvin depending upon the structure. Above a carbon concentration of 45%, $T_c$ decreases rapidly and virtually disappears above 70%. As above mentioned, the most pronounced AC to DC conversion factor of about $0.5 \times 10^6$ so far observed, was in the $Mo_{63}C_{37}$ sample.

Figure 7:
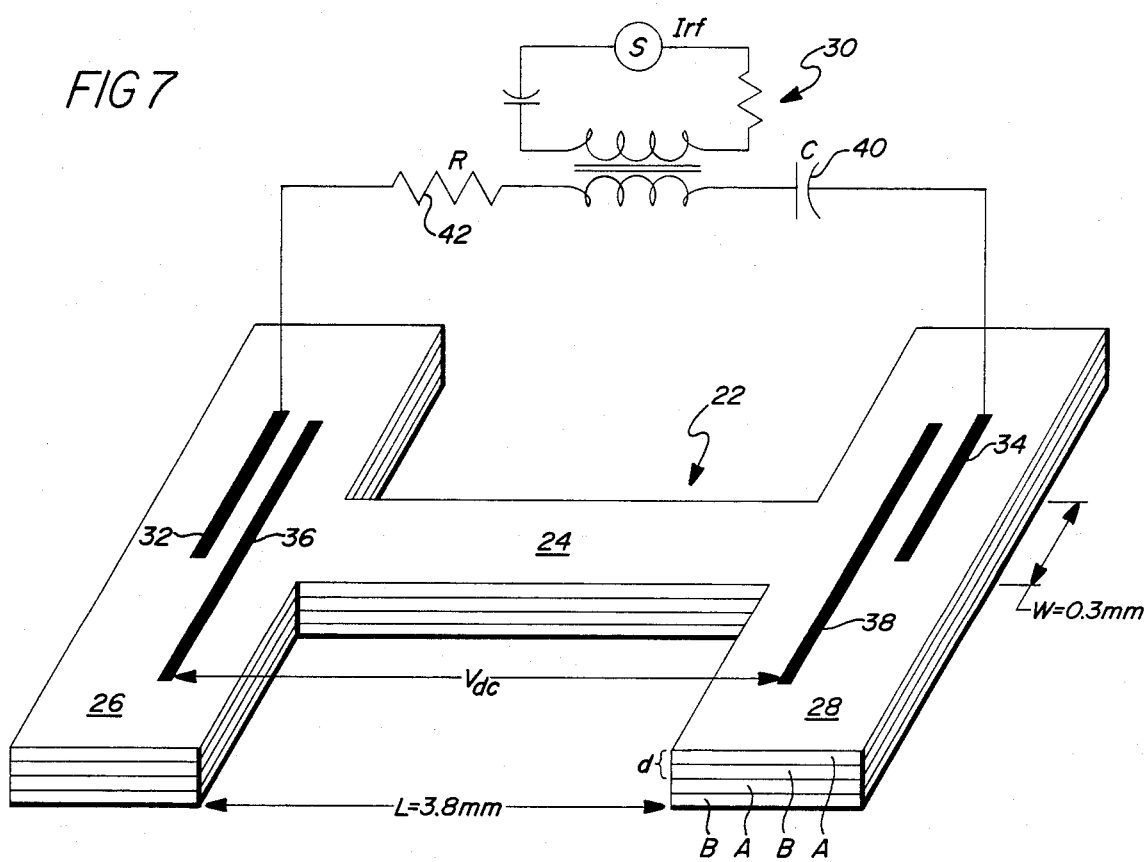
FIG. 7 is a schematic diagram of a measuring configuration of one embodiment of the multilayer films of the invention.

A second multilayer embodiment 22 of the films of the invention is illustrated in FIG. 7. In this multilayer embodiment 22, $V_{dc}$ is induced by $I_{rf}$ when the film 22 has a magnetic field applied thereto. The polarity of $V_{dc}$ oscillates as a function of the applied magnetic field and the polarity can be changed by reversing the orientation of the applied field. It again appears that $V_{dc}$ is an induced emf voltage and not a time averaged voltage drop in the film 22. It is believed that the AC to DC conversion effect is due to the Josephson effect associated with the oscillation of coherent vortices and/or asymmetrical vortex flow crossing the layers.

The geometry of the film 22 studied as illustrated in FIG. 7, was chosen only for convenience in measuring the film and is not otherwise of importance. As illustrated, the unitary film 22 is H-shaped with a crosspiece 24 and a pair of end pieces 26 and 28. The crosspiece 24 has a width of 0.3 mm and length of 3.8 mm. The film 22 is formed of a plurality of layers, generally A and B, formed sequentially upon one another. The individual layers varied in thickness from 10 to 60 Å and the films 22 were formed of 20 to 100 layer pairs of A and B. Multilayer structures having layer sets such as A, B, C, etc., can also be formed.

The spacing or thickness of a layer pair of A and B is generally called the d spacing. The films 22 were formed of alternating layers A and B of a metallic material or element and a semiconductor material or element, including those materials above mentioned with respect to the inhomogeneous films. The most optimized pronounced effect so far observed was in a MoSi multilayer film having 80 layers of Mo and Si with a d spacing of approximately 32 Å, which is the first example in Table 2. The representative results in Table 2 are also unoptimized. Optimized in the multilayer structures means the best choice of $H_{\|}$, $I_{rf}$ and T as well as the layer spacing d and combination of element.

TABLE 2

| Composition | Layer Spacing in Angstroms | $V_{dc}$ in Microvolts | Conversion Factor |
|---|---|---|---|
| $Mo_{50}Si_{50}$ | 32 | 9 | $4 \times 10^3$ |
| $W_{50}C_{50}$ | 25 | 37 | $1.8 \times 10^4$ |
| $Nb_{67}C_{33}$ | 32 | 4 | $2 \times 10^3$ |
| $W_{50}Si_{50}$ | 10 | 50 | $2.5 \times 10^4$ |
| $Mo_{58}Zr_6C_{36}$ | 48 | 4 | $2 \times 10^3$ |

The layers were formed by depositing alternate layers of Mo and Si by sequential sputtering onto substrate which is passed by the material source sequentially or sequentially oscillated back and forth past the sources. The layer spacing was determined by X-ray diffraction and the film composition was determined by Auger analysis. The layered films also were formed by magnetron sputtering at room temperature in argon with 2 microns background pressure. The periodic layer spacing determined by X-ray diffraction was in agreement with the total film thickness divided by the number of rotations of the substrate during the deposition. The smoothness of the interface between the layers A and B was determined to be about 2 Å, by X-ray diffraction. The characteristic length of the multilayer structures is defined as the d spacing of the layers. For the effect to occur, this has been on the order of 500 Å or less and preferably is on the order of 100 Å or less.

Figure 8:
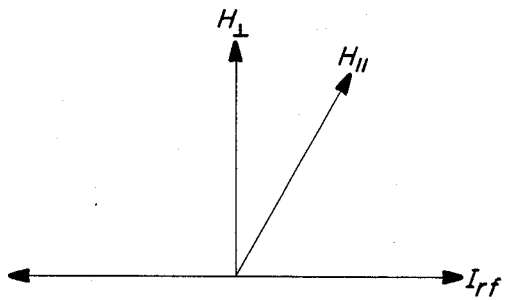
FIG. 8 is a diagram of the magnetic fields applied to the film of FIG. 7.

The films 22 were measured utilizing a circuit 30. The DC resistive transition R was measured utilizing a conventional four probe arrangement. Both R versus T and R versus an applied parallel magnetic field ($H_{\|}$) exhibited a smooth transition without any abrupt steps which indicated the films are substantially continuous along the layers. The orientation of the applied AC current $I_{rf}$ and the parallel magnetic field ($H_{\|}$) are illustrated in FIG. 8. $I_{rf}$ flows along the layer planes in the crosspiece 24 and $H_{\|}$ is applied along the layer planes, but perpendicular to the flow of $I_{rf}$. A perpendicular magnetic field $H_{\|}$ is also illustrated, which is perpendicular to the layer planes in the film 22.

The MoSi multilayer film has an average resistivity of 108 microhm cm and a critical temperature ($T_c$) of about 6 Kelvin. The Josephson coupling occurs between the metallic layers and the thin insulating layers of silicon. The RF bias measurements were made by applying $I_{rf}$ to the film 22 at frequencies of 1–5 MHz. The current $I_{rf}$ is applied to a pair of contacts or leads 32 and 34, located respectively on the outside of the end pieces 26 and 28. $V_{dc}$ is measured between an inner pair of contacts or leads 36 and 38, also located on the respective end pieces 26 and 28.

The impedance of the circuit 30 is at least two orders of magnitude greater than the normal state resistance $R_N$ of the film 22. Again, to ensure that no DC current is applied to the film 22, a blocking capacitor 40, about 100 picofarads, is included in the circuit 30. The absence of any residual DC current was also verified by measuring the resistance across a resistor 42 and by utilizing a sensitive ammeter.

Figure 9A:
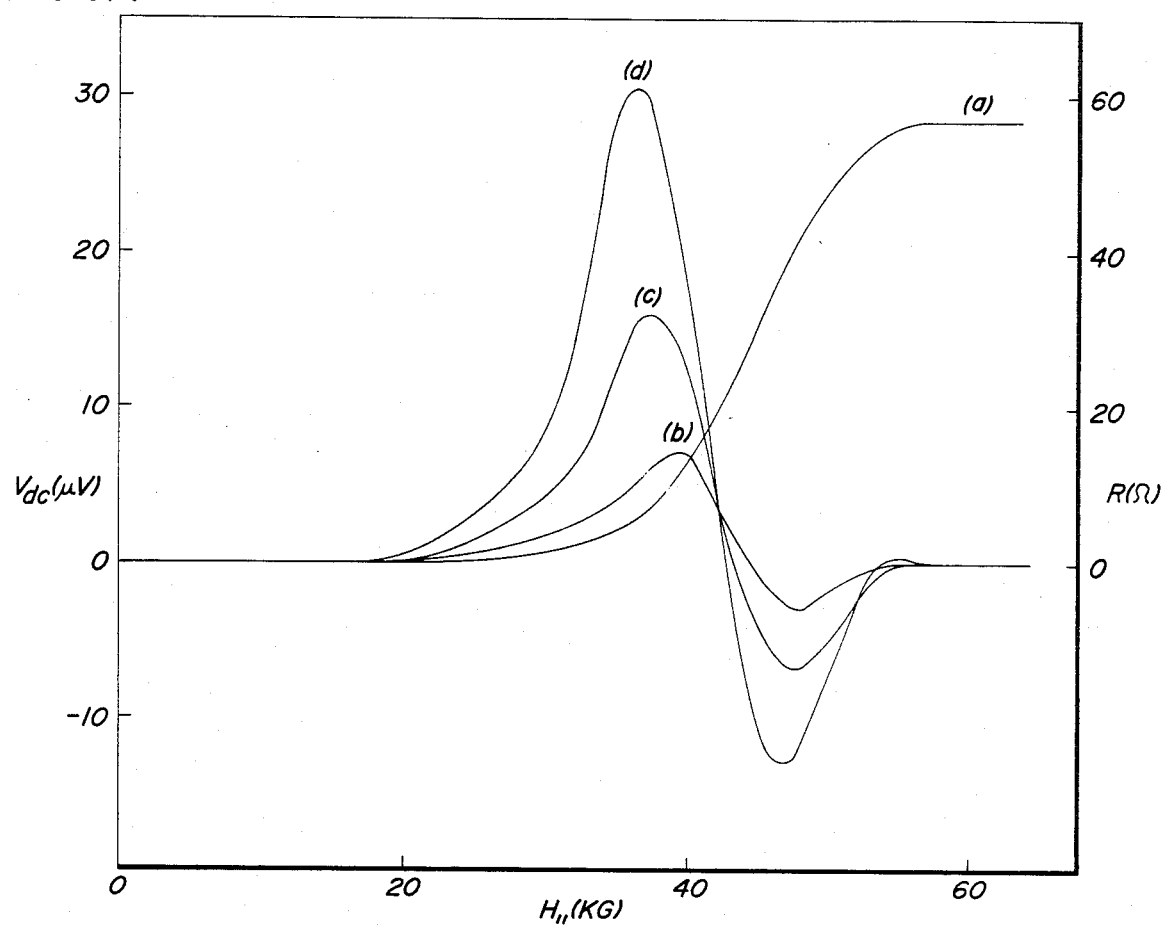
FIG. 9A(a) is a graph of the resistance as a function of the applied parallel magnetic field ($H_\parallel$)

Applying $I_{rf}$ with $H_{\|}$, $V_{dc}$ was observed along the length of the layer planes in the film 22. FIGS. 9A (b–d) and 9B (e–h) illustrate graphs of $V_{dc}$ versus $H_{\|}$ for different amplitudes of $I_{rf}$. $V_{dc}$ was observed in the presence of both $H_{\|}$ and $H_\perp$ for a wide range of temperatures on the order of 3 to 6 Kelvin, which corresponds to 0.5 $T_c$ to $T_c$. The temperature range was limited by the magnetic field strength applied, which was about 90 Kilogauss (KG). FIG. 9A(a) is a graph of the resistive transition range which overlaps with the range of $V_{dc}$.

The properties of $V_{dc}$ are different when induced by $H_\perp$ instead of $H_{\|}$ and appear to be more systematic when $H_{\|}$ is applied. When the direction or orientation of $H_{\|}$ is reversed, the polarity of $V_{dc}$ is reversed. The effect of $H_\perp$ on $V_{dc}$ ($V_{dc}$ vs. $H_\perp$) are irregular and more complex. Further, the polarity of $V_{dc}$ is not systematically dependent upon the orientation of $H_\perp$. Therefore, application of $H_{\|}$ is preferable and the following explanation is related only to $H_{\|}$.

Figure 9B:
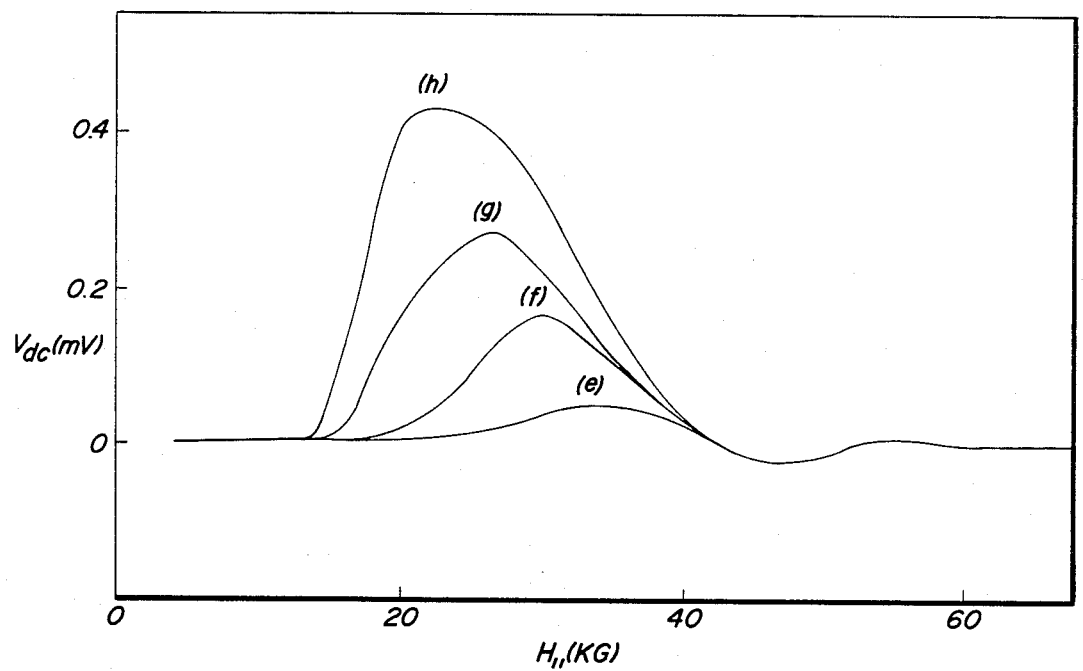

Varying $I_{rf}$ at a temperature slightly below $T_c$, causes $V_{dc}$ to oscillate as a function of $H_{\|}$ as illustrated in FIG. 9A (b–d). The overall magnitude of $V_{dc}$ increases with an increasing amplitude of $I_{rf}$ as illustrated in FIG. 9B. $V_{dc}$ develops a major peak as a function of $H_{\|}$ with an increasing amplitude or frequency of $I_{rf}$. The peak saturates at 0.5 mV at $I_{rf}=100$ microamps peak-to-peak (curve (h)). At higher frequencies of $I_{rf}$, the saturation amplitudes increase. The largest value of $V_{dc}$ which has been observed is more than 2 mV at 3 MHz (not illustrated). In terms of the Josephson voltage frequency relation, the conversion factor n is about $3.3 \times 10^5$.

As mentioned above, $V_{dc}$ either oscillates as a function $H_{\|}$ or has a single major peak. The polarity of $V_{dc}$ in either case, can be completely reversed by reversing the orientation of $H_{\|}$.

Figure 10:
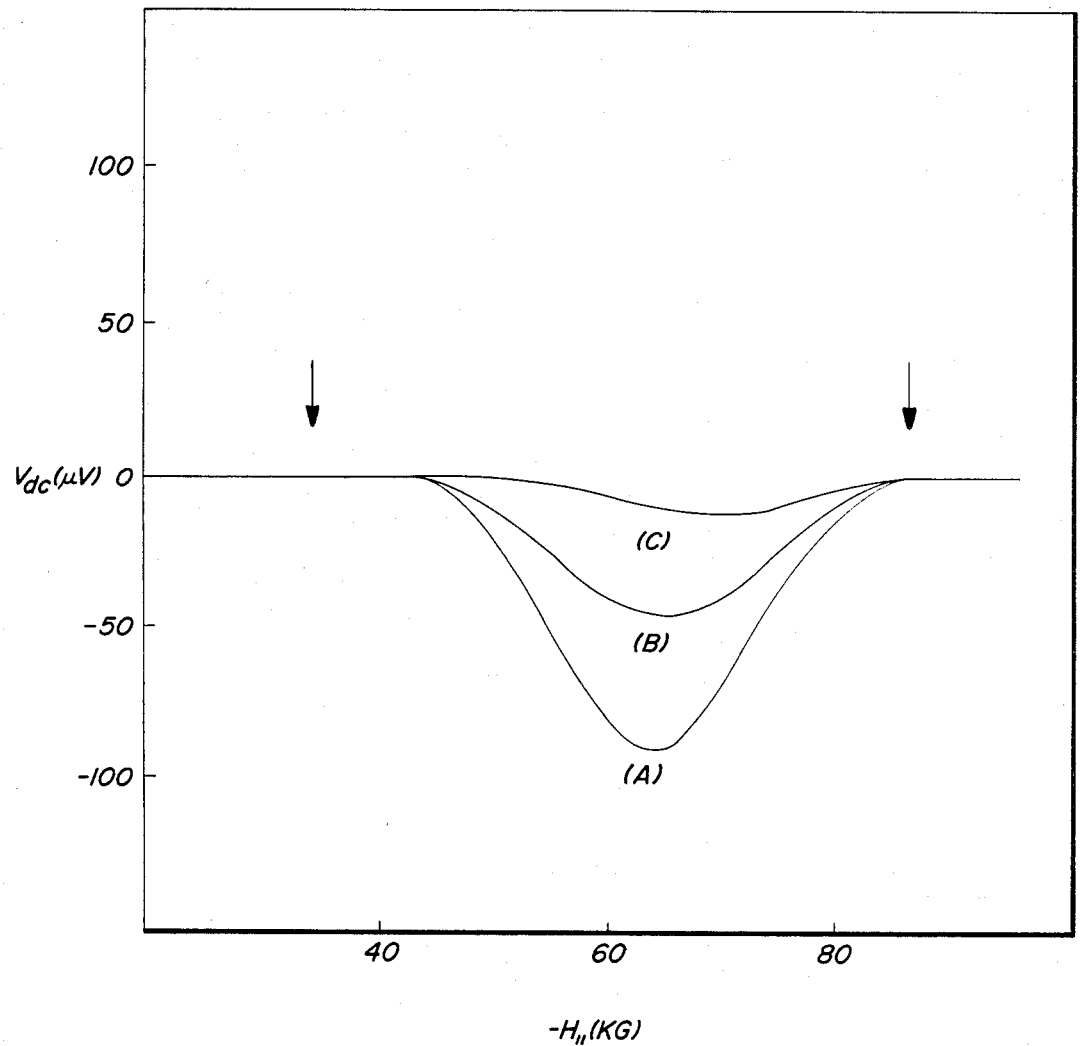
FIG. 10 is a graph of an increase in the effect of capacitance on $V_{dc}$ from (A) to (C)

FIG. 10 illustrates three graphs of $V_{dc}$ as a function of $H_{\|}$, in a test configuration which demonstrates that the induced voltage $V_{dc}$ is originated by the RF input signal. The orientation of $H_{\|}$ is reversed as indicated by $-H_{\|}$. A shunting capacitor (not illustrated) is connected in parallel with the film. No significant change in $V_{dc}$ is observed until the capacitance was increased to more than 0.001 microfarads. For a frequency of 1 MHz and a capacitance of 0.005 microfarads, the impedance of the capacitor is 32 ohms which is less than the normal state film resistance of 55 ohms. The effect of the parallel shunting capacitor is to reduce the RF current and RF voltage in the film. The above result demonstrates that $V_{dc}$ is not induced by a residual DC source of unknown origin in the circuit.

Figure 11:
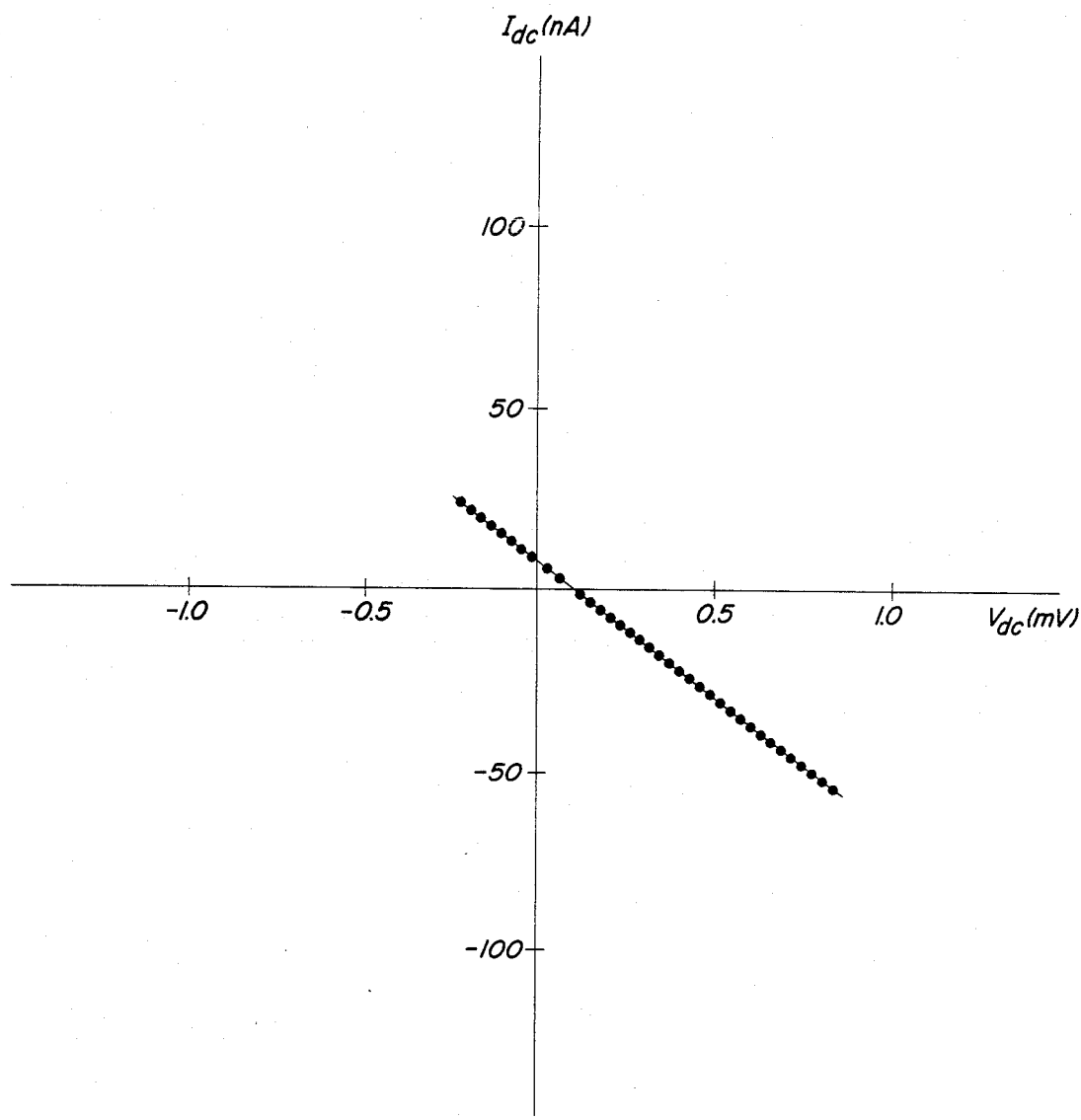
FIG. 11 is a graph of the induced dc current ($I_{dc}$) versus $V_{dc}$ obtained by varying the applied parallel magnetic field.

The induced voltage $V_{dc}$ can act like an emf source as illustrated in FIG. 11. To obtain the measurements illustrated in FIG. 11, the capacitor 40 is removed and the DC induced current $I_{dc}$ is measured through resistor 42 versus $V_{dc}$. Both $I_{dc}$ and $V_{dc}$ can be varied by changing $H_{\parallel}$, f and the amplitude of $I_{rf}$. Except for a small offset, which can be attributed to the thermal emf, the resulting curve depends upon the resistance of the circuit and not the film resistance. This dependence is observed both from the fact that $I_{dc}$ flows out of the positive terminal of the film and from the slope of the resulting curve. The ratio of $\Delta V/\Delta I$ as determined from the slope of the curve is approximately $-1.1 \times 10^4$ ohms, while the total measured resistance of the circuit is $1.045 \times 10^4$ ohms.

Figure 12:
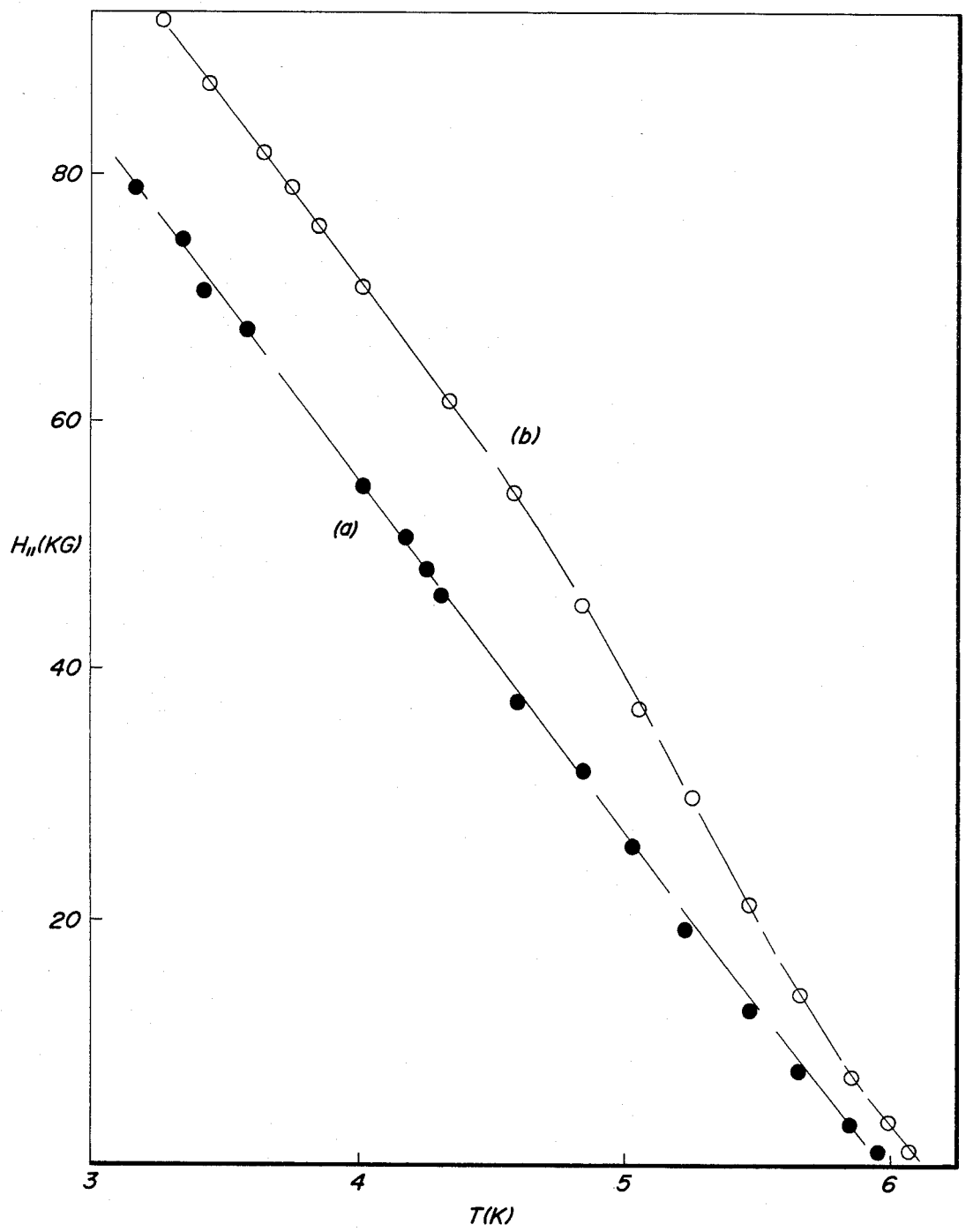
FIG. 12(a) is a graph of the applied magnetic field at the peak $V_{dc}$ as a function of temperature.
FIG. 12(b) is a graph of the upper parallel critical field taken from $R=0.99\ R_n$ versus temperature.

FIG. 12(a) illustrates that the value of $H_{\parallel}$ for the maximum $V_{dc}$ has a simple temperature dependence, which is proportional to $(1-T/T_c)$ for the value of $0.5 < T/T_c < 1$. For a value of $T < 0.5\ T_c$, the required $H_{\parallel}$ is greater than the experimental capability. For comparison, the upper critical field $H_{c2\parallel}$ of the film is illustrated by FIG. 12(b).

One major difference in the layered composite films of the invention and other prior systems having some Josephson effect, is that the films of the invention form junctions across the insulating layers and along the planes of the layers. This effect is attained by forming the thickness of each superconducting layer to be less than the coherence length.

Numerous modifications and variations of the present invention are possible in light of the above techniques. The substrates utilized can be rigid or flexible and can be formed from numerous materials, such as crystalline silicon, glass, ceramics or polymers. The substrate can be a large area substrate and can be of any number of complicated shapes, not just planar. The deposition techniques are not limited to sputtering and can include numerous types of deposition techniques or combinations thereof. It is therefore to be understood that within the scope of the appended claims the invention can be practiced otherwise than as specifically described.

What is claimed and desired to be secured by Letters Patent of the United States is:

1. A superconducting film comprising:
a non-equilibrium structure providing local variations in superconducting transition temperature, said structure formed from at least two components, at least one of said components being a metallic material and at least one of said components being a non-metallic material, said structure including a plurality of regions exhibiting characteristic lengths in at least two directions through the structure of less than 500 Angstroms to provide AC to DC conversion of an RF AC signal imposed on the structure in the absence of a magnetic field applied thereto, said structure having an oxygen content throughout the structure of less than ten percent, said structure includes a microscopically inhomogeneous microstructure providing said characteristic length and said microstructure being a columnar microstructure.

2. The film defined in claim 1 wherein:
said inhomogeneous microstructure range in size from 10 to 1000 Å to provide said characteristic lengths.

3. The film defined in claim 1 wherein:
said structure is substantially compositionally homogeneous.

4. The film defined in claim 1 wherein:
said structure has an RF to DC conversion factor greater than $10^6$.

5. The film defined in claim 1 wherein:
said structure is formed from at least one element of the metallic group consisting of Mo, Nb, V, W and Zr and at least one element of the nonmetallic group consisting of B, C, Ge, N, P and Si.

6. The film defined in claim 1 wherein:
said characteristic lengths are less than 100 Angstroms.

7. The film defined in claim 1 wherein:
said structure is formed from molybdenum and at least one nonmetallic element.

8. The film defined in claim 7 wherein:
said structure is about 63 percent molybdenum and 37 percent carbon.

9. A superconducting film comprising:
a non-equilibrium structure providing local variations in superconducting transition temperature, said structure formed from at least two components, at least one of said components being a metallic material and at least one of said components being a non-metallic material, said structure including a plurality of regions exhibiting characteristic lengths in only one direction through the structure of less than 500 Angstroms to provide AC to DC conversion of an RF AC signal imposed on the structure in the presence of a magnetic field applied thereto, said structure having an oxygen content throughout the structure of less than ten percent, and said structure being multilayer composite film providing said characteristic length.

10. The film defined in claim 9 wherein:
said multilayer film is formed of alternating layers of an insulating material and a metallic superconducting material.

11. The film defined in claim 9 wherein:
said multilayer film is substantially compositionally homogeneous in each of the layers in said multilayer film.

12. The film defined in claim 9 wherein:
said multilayer film is formed from alternating layer pairs formed of molybdenum and silicon.

13. The film defined in claim 12 wherein:
said film has about 80 layer pairs having a spacing of about 32 Å.

* * * * *